United States Patent
Cote et al.

[11] Patent Number: 5,926,689
[45] Date of Patent: Jul. 20, 1999

[54] PROCESS FOR REDUCING CIRCUIT DAMAGE DURING PECVD IN SINGLE WAFER PECVD SYSTEM

[75] Inventors: Donna Rizzone Cote, Poughquag, N.Y.; John Curt Forster, San Francisco, Calif.; Virinder Singh Grewal, Fishkill, N.Y.; Anthony Joseph Konecni, Plano, Tex.; Dragan Valentin Podlesnik, Palo Alto, Calif.

[73] Assignees: International Business Machines Corporation, Armonk, N.Y.; Siemens Aktiengesellschaft, Munich, Germany

[21] Appl. No.: 08/574,748

[22] Filed: Dec. 19, 1995

[51] Int. Cl.$^6$ .................................................. H01L 21/306
[52] U.S. Cl. ............................. 438/10; 427/10; 438/786
[58] Field of Search .................................. 438/758, 778, 438/786, 788, 789, 792, 793, 10, 17; 427/579, 10

[56] References Cited

U.S. PATENT DOCUMENTS

| | | | |
|---|---|---|---|
| 4,426,274 | 1/1984 | Ephrath | 204/298 |
| 4,826,784 | 5/1989 | Salerno et al. | 437/89 |
| 4,851,367 | 7/1989 | Wolf | 437/101 |
| 4,933,203 | 6/1990 | Curtins | 427/38 |
| 5,000,113 | 3/1991 | Wang et al. | 118/723 |
| 5,017,403 | 5/1991 | Pang et al. | 427/39 |
| 5,082,542 | 1/1992 | Moslehi et al. | 204/192.32 |
| 5,120,680 | 6/1992 | Foo et al. | 437/238 |
| 5,158,644 | 10/1992 | Cheung et al. | 156/643 |
| 5,192,849 | 3/1993 | Moslehi | 219/121.43 |
| 5,260,236 | 11/1993 | Petro et al. | 437/241 |
| 5,271,972 | 12/1993 | Kwok et al. | 427/579 |
| 5,370,912 | 12/1994 | Bigelow et al. | 427/575 |
| 5,472,561 | 12/1995 | Williams et al. | 156/627.1 |
| 5,637,190 | 6/1997 | Liao | 438/758 |

FOREIGN PATENT DOCUMENTS

| | | | |
|---|---|---|---|
| 0272140 | 12/1987 | European Pat. Off. | C23C 16/54 |
| 392134 | 10/1990 | European Pat. Off. | |
| 0661732A2 | 11/1994 | European Pat. Off. | H01L 21/316 |

*Primary Examiner*—Charles Bowers
*Assistant Examiner*—Matthew Whipple
*Attorney, Agent, or Firm*—Perman & Green, L.L.P.; Daryl K. Neff, Esq.

[57] ABSTRACT

In a PECVD process, the plasma potential is controlled and maintained at a uniform level to confine the formed plasma to the gap area between the electrodes away from the influence of the walls of the discharge chamber. The plasma potential is controlled by operating the system at a high pressure, above about 12 Torr, and monitoring the operation by observing the DC bias on the upper or driven electrode until a positive potential, preferably greater than about 10V, is developed. At this point a symmetrical glow discharge and a controlled plasma exists between the driven electrode and the susceptor electrode, controllable by maintaining the pressure between about 14 and 20 Torr, to reduce plasma damage to the semiconductor body being coated which maximizes yield.

3 Claims, 2 Drawing Sheets

PROCESS FOR REDUCING CIRCUIT DAMAGE DURING PECVD IN SINGLE WAFER PECVD SYSTEM

FIELD OF THE INVENTION

The present invention relates to semi-conductor fabrication, and particularly to the deposition of a passivation layer on an integrated circuit wafer.

BACKGROUND OF THE INVENTION

Dielectric or passivation layers are often deposited on a semiconductor body using a chemical vapor deposition (CVD) process wherein solid dielectric films are formed on an integrated circuit wafer by the chemical reaction of vapor phase chemicals (reactants) that contain the required constituent gases. PECVD systems are categorized by pressure and by its method of energy input. PECVD systems do not rely solely on thermal energy, but instead use a radio-frequency (RF) induced glow discharge plasma to transfer energy into the reactant gases, allowing the integrated circuit wafer to remain at a lower temperature than in other processes.

Typically, in PECVD systems, the dielectric films are deposited in low frequency, lower power density batch reactors. Batch reactors accommodate a large number of wafers at the same time. In low power density processes, the RF power is distributed over large numbers of wafers, wherein each wafer is subjected to a low power density plasma. Under these conditions, the deposition time is long. Low frequency processes also have other drawbacks. In low frequency processes, the films tend to be very sensitive to the particular device pattern. In other words, a different process is required to fabricate each different type of device, where each wafer contains different device patterns. Secondly, low frequency processes tend to produce passivation films which are nonuniform across the wafer. The question of uniformity also arises where the wafer has a variety of devices on it with a varying structure density. Batch systems also have a higher wafer-to-wafer thickness nonuniformity as compared to single-wafer systems.

In conventional plasma processes, there is a trade-off between processing rate or throughput and the semiconductor device quality. To enhance the processing rate, the plasma density and ion flux should be increased. According to conventional plasma processing methods, increasing the RF power that produces the plasma increases ion density. Increasing the RF power to the plasma medium, however, also raises the average plasma ion energy levels, and ions with excessive directional energies (e.g. several hundred electron volts) may damage the semiconductor devices. This is because the ions are so energetic that upon impact they penetrate and cause irradiation damage to the semiconductor device surface. When this type of ion-induced radiation damage occurs, a post-fabrication cleansing or annealing process is necessary to minimize the adverse effects to semiconductor device performance. Moreover, many anisotropic plasma etch processes usually leave undesirable chemical deposits such as fluorohydrocarbons on the semiconductor wafer surface, resulting in manufacturing yield degradation. Ultimately, the manufacturer must remove these deposits from the semiconductor surface by some post-etch cleaning. In conventional plasma processing techniques, the plasma medium can interact with the plasma chamber walls, resulting in deposition of various contaminants (such as metals) onto the semiconductor wafer (contaminants are sputter etched from the plasma electrodes and reactor walls).

The combined effects of irradiation damage, formation of fluro-carbon films, plasma-induced contaminants, and other undesirable phenomena produce semiconductor devices with less than optimal performance yield. Thus, with conventional plasma-assisted processing techniques, increasing RF power to increase ion density with the intent to raise the process rate can have serious detrimental effects. If a method existed, however, to increase the plasma density and ion flux while controlling and confining the glow discharge, then a manufacturer could increase plasma-assisted processing rates without device yield degradation.

Therefore, a need exists for a method and apparatus to increase ion density near a semiconductor device during plasma-assisted processing without at the same time producing an unconfined glow discharge.

As mentioned earlier, another limitation of conventional plasma-assisted processes derives from the fact that, during these processes, plasma disperses throughout the fabrication process chamber. In so doing, it interacts with the process chamber walls. These walls contain various metals that the plasma species can remove via sputter etch or chemical reactions, transport to the semiconductor device surface, and embed into the semiconductor device. As a result, further semiconductor device degradation occurs.

Consequently, there is a need for a method and apparatus to prevent plasma interaction with fabrication reactor process chamber walls during plasma-assisted processing.

The present invention avoids these drawbacks of a high frequency, high RF power density single wafer PECVD process by operating the PECVD reactor under controlled conditions in which the glow discharge is confined and does not interact with the walls of the reactor, to fabricate a dielectric layer such as a passivation layer of oxynitride.

The present invention operates on single wafers, irrespective of device type, to produce a uniform dielectric film thereon. However the use of high frequency RF power in very large scale integration (VLSI) circuits normally presents problems with respect to damage to the circuit elements during plasma processing. The thin gate oxide (<200Å) commonly used as the gate insulator of FET transistors, for example, is susceptible to breakdown during processing steps in which the gate electrode is exposed to the processing plasma. In particular, the use of plasma enhanced chemical vapor deposition (PECVD) to deposit dielectric layers onto the transistor can result in damage and yield reduction if the glow discharge is not controlled and confined.

SUMMARY OF THE INVENTION

The novel process of the present invention is based upon the discovery that the cause of damage and reduced yield in prior known high power RF plasma-enhanced chemical vapor deposition processes is the failure to control or confine the plasma glow discharge, resulting in an interaction between the plasma glow discharge and the walls of the discharge chamber in the areas adjacent the discharge gap between the upper and lower electrodes within the chamber. This results in a dissipated or grounded non-uniform plasma potential between the electrodes and causes the formed plasma to interact with the walls of the discharge chamber rather than being confined and controlled uniformly in the gap area between the electrodes as a symmetric discharge.

The present invention enables the plasma potential to be controlled and maintained at a uniform predetermined level at which the formed plasma is confined to the gap area between the electrodes away from the influence of the walls of the discharge chamber, with resultant reduction in damage to the circuit elements on the wafer supported on the lower electrode or susceptor electrode while using sufficiently high power to achieve high density films.

The plasma potential is controlled according to the present invention by operating the system at a high pressure, above about 12 Torr, and monitoring the operation by observing the DC bias on the upper or driven electrode until a positive potential, preferably greater than about 10V, is developed. At this point a symmetrical glow discharge and a controlled plasma exists between the driven electrode and the susceptor electrode, controllable by maintaining the pressure between about 14 and 20 Torr.

THE DRAWING

In the accompanying drawing,

FIG. 1 is a schematic side illustration of a PECVD apparatus according to an embodiment of the present invention;

FIG. 2 is an illustration of a uniform plasma confined between the electrodes of the apparatus of FIG. 1 having a uniform planarization voltage maintained therebetween, and FIG. 3 is an illustration, comparative to that of FIG. 2, but showing the unconfined plasma between the electrodes and diffused out to the wall of the deposition chamber resulting from an unbalanced planarization voltage or negative potential DC bias on the upper or driven electrode.

DETAILED DESCRIPTION

Figure 1:
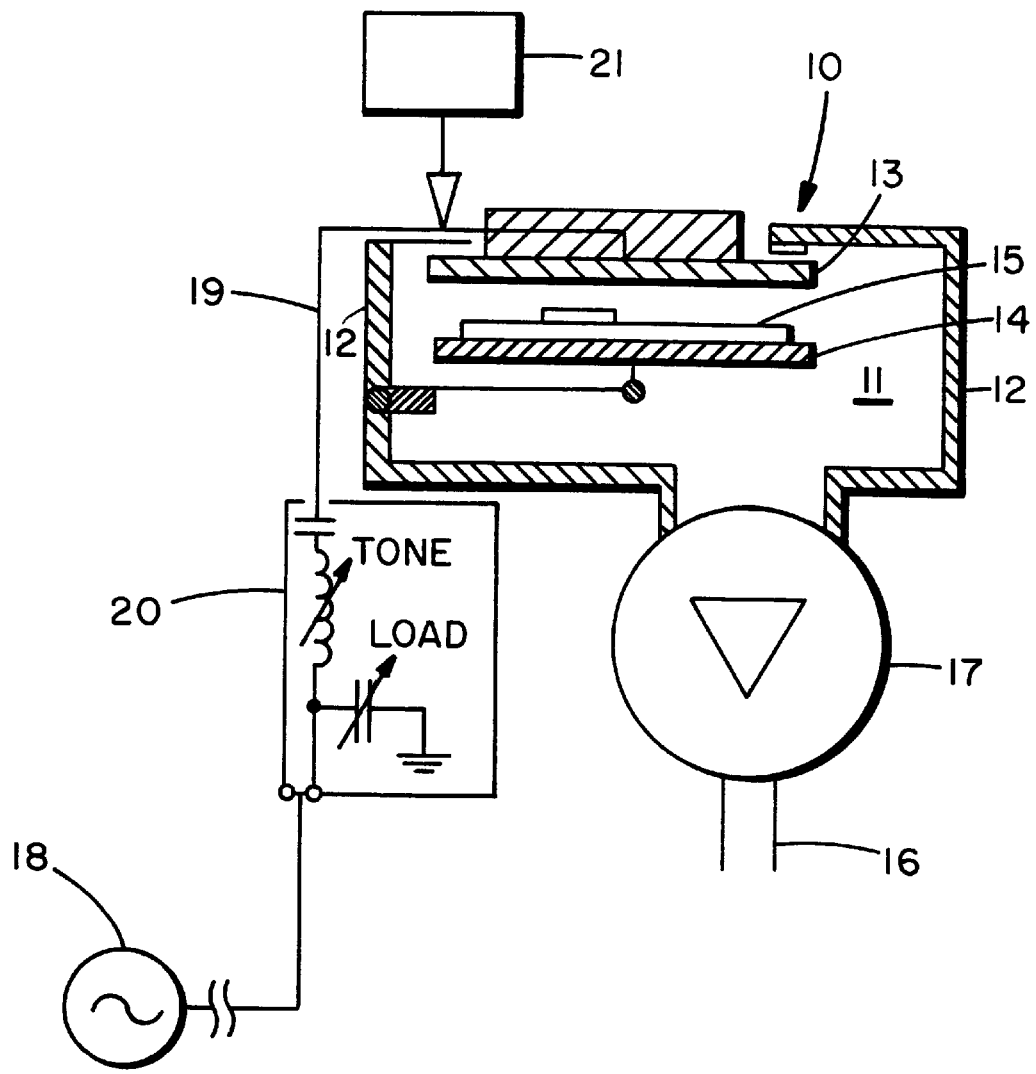

Referring to FIG. 1, the PECVD apparatus 10 illustrated thereby comprises a plasma deposition chamber 11 enclosed by walls 12, an upper or driven electrode 13 spaced above a grounded lower or susceptor electrode 14 supporting a semiconductor integrated circuit wafer 15 to be plasma-coated with a passivating layer.

The upper electrode 13 is driven at high power by connection to a source of RF energy and preferably comprises a conventional showerhead structure associated with sources of one or more gas mixtures for introducing the plasma sources to the chamber 11. The sealed chamber 11 has a pressure inlet 16 containing a control valve 17 for maintaining a desired pressure within the chamber 11.

A variable RF generator 18 is coupled to the showerhead electrode 13 by RF line 19 to apply an RF potential thereto which sets up a discharge potential across the electrodes 13 and 14. This allows the wafer 15 to be exposed to an RF plasma as the gas mixtures, introduced to the sealed chamber 11 are reduced to a plasma by the discharge, to cause the gases to react and deposit the desired passivation layer onto the wafer 15 under the predetermined high vacuum pressure conditions.

The RF line 19 to the electrode 13 is associated with a variable RF voltage regulator 20; such as one containing variable capacitors, and with a means 21 for measuring the RF voltage and the DC voltage at the top electrode 13. In operation, the RF power discharge generates a plasma and a self-induced negative DC bias between the driven electrode 13 and the semiconductor wafer 15 on the lower electrode 14. Electrons within the plasma create a perpendicular electric field which results in enhanced plasma density and confined plasma near the wafer surface. The self-induced DC voltage generates an electric field perpendicular to the cathode or wafer surface. The electrons experience motion along a path that parallels the semiconductor wafer 22 face.

Figure 2:
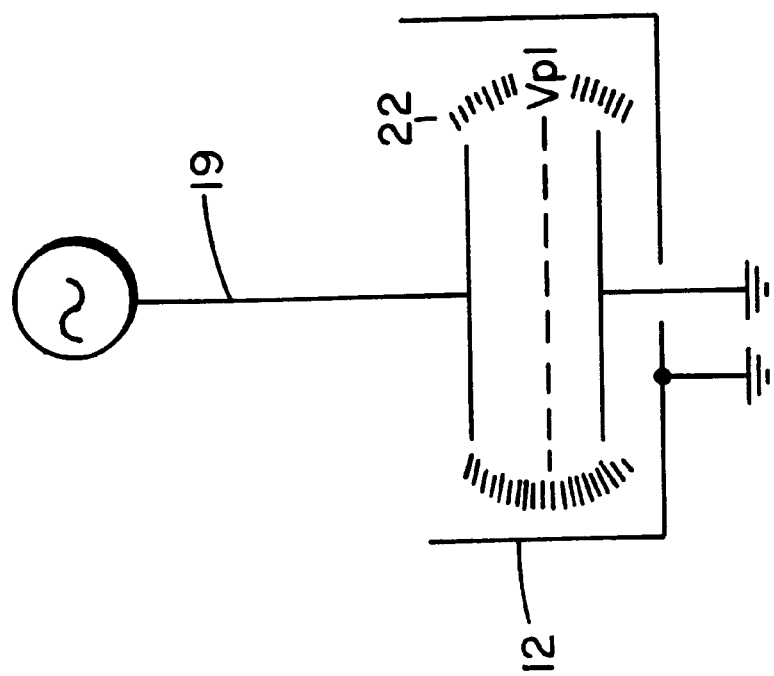

We have discovered that the PECVD process can be conducted at elevated pressure, and at high RF power density without encountering the prior-art disadvantages, by monitoring the RF voltage and the DC voltage at the top or driven electrode 13, i.e., the DC bias on the driven electrode, and by regulating the pressure and/or the RF power in order to cause the DC bias to float towards a positive potential greater than about 10 volts. Under such conditions the plasma glow discharge 22 is controlled and confined to the gap area between the electrodes 13 and 14 as the plasma potential is maintained uniform, as illustrated by FIG. 2 of the drawings.

Figure 3:
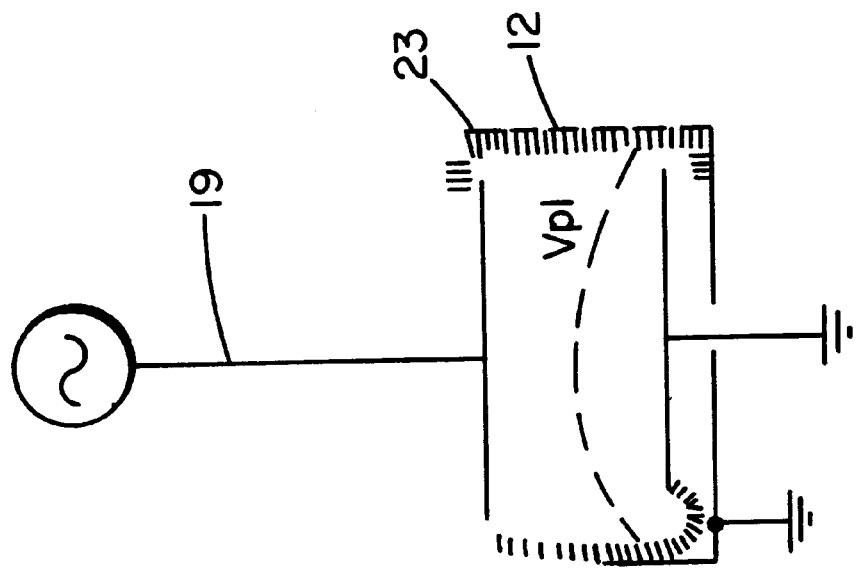

FIG. 3 illustrates the interaction between an unconfined glow discharge 23 and the reactor housing walls 12 resulting from reaction conditions in which the plasma potential is unconfined and the glow discharge 23 extends outwardly to the reactor walls 12.

According to the present invention, a high density, high frequency, single wafer, plasma-enhanced chemical vapor deposition (PECVD) process for depositing a dielectric layer such as a passivation layer on an integrated circuit semiconductor wafer is described. In one embodiment, the wafer is placed on a first or driven electrode, a grounded susceptor, in a reaction chamber 22. The wafer 15 is then heated to a process temperature. In the currently preferred embodiment, the process temperature ranges from 350°–430° C. Next, the chamber 11 is pressurized. The pressure range for the currently preferred embodiment is from about 12 to 20 torr.

After high pressure has been achieved, a gas mixture, such as one consisting of nitrogen, silane, ammonia and nitrous oxide, is introduced to the chamber 11 through an upper electrode 13 which is designed like a showerhead. The gas mixture flows directly on top of the wafer 15. A radio-frequency (RF) potential is then applied to the showerhead electrode through line 19, causing excitation and ionization of the gas mixture leading to chemical reaction and the formation of a passivation film on the wafer 15.

At this point in the process, the plasma potential at the upper driven electrode 13 is measured and controlled at a steady positive DC bias or potential greater than about 10V to produce a uniform confined glow discharge 22 as illustrated by FIG. 2. Such measurement may be made by means of a voltmeter 21 or similar device connector to the driven electrode 13, as shown in FIG. 1. Changes necessary to adjust the DC voltage bias or potential to a value greater than about 10V include adjusting the pressure to a value between about 12 torr and 20 torr and/or adjusting the RF frequency until the DC bias reading drifts to a positive potential, preferably greater than about 10V. Such conditions maintain a steady plasma potential and a confined glow discharge 22.

The films formed with the described process simultaneously exhibit low particle densities, high UV transparency, low within-wafer and wafer-to-wafer thickness variations, low pattern sensitivity, high moisture resistance, no pinholes, low stress, good step coverage, and low bound hydrogen content. The gas mixture flows through the showerhead electrode 13 from a gas manifold. Each gas enters the gas manifold from a separate gas line. Each gas line utilizes control valves which operate to minimize particle production in the reaction chamber 11.

The foregoing description relates specifically to the use of a PECVD system and apparatus commercially available from Applied Materials under the designation AME 5000, but applies equally well to other PECVD devices in which the pressure and RF power are adjustable to obtain and maintain a controlled plasma potential which confines the gas plasma between the electrodes and spaced from the walls of the reaction chamber. The specific adjustment values will vary somewhat depending upon the particular PECVD apparatus used and the dimensions of its reaction chamber, electrode gap and distance from the chamber walls. However the advantages of the present process apply equally well to PECVD devices of all types and dimensions.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A plasma-enhanced chemical vapor deposition (PECVD) process for depositing a dielectric layer on the surface a semiconductor body while minimizing plasma damage to the semiconductor body and increasing yield, comprising the steps of positioning a semiconductor body on the surface of a susceptor electrode which is spaced from a driven electrode by a narrow discharge gap, said electrodes being contained within the reaction chamber of a PECVD apparatus and spaced from the chamber walls; introducing a mixture of gases to said chamber which are capable of vaporization, reaction and deposition as a dielectric layer on the surface of the semiconductor body on said susceptor electrode; pressurizing said reactor chamber to a pressure between about 14 and 20 Torr; applying a RF power to the driven electrode to create an RF plasma potential in the gap between the electrodes and a negative DC bias on the driven electrode, and to form a chemical vapor plasma glow discharge of said gases in said gap, resulting in the reaction and deposition of said dielectric layer on the surface of the semiconductor; monitoring said DC bias on the driven electrode; controlling the DC bias by adjusting the RF power and/or the pressure within the range of about 14 and 20 Torr using the monitored DC bias as feedback until said DC bias floats to a positive potential greater than 10V, whereby said plasma glow discharge is symmetrical and uniform, is confined within the gap between said electrodes and does not interact with said chamber walls.

2. Process according to claim 1 in which said dielectric layer is a planarization layer.

3. Process according to claim 1 in which said semiconductor body is a transistor.

* * * * *